(12) United States Patent
Milligan et al.

(10) Patent No.: US 9,466,574 B2
(45) Date of Patent: Oct. 11, 2016

(54) PLASMA-ENHANCED ATOMIC LAYER DEPOSITION OF CONDUCTIVE MATERIAL OVER DIELECTRIC LAYERS

(71) Applicant: ASM AMERICA, INC., Phoenix, AZ (US)

(72) Inventors: Robert B. Milligan, Gold Canyon, AZ (US); Dong Li, Phoenix, AZ (US); Steven Marcus, Tempe, AZ (US)

(73) Assignee: ASM AMERICA, INC., Phoenix, AZ (US)

( * ) Notice: Subject to any disclaimer, the term of this patent is extended or adjusted under 35 U.S.C. 154(b) by 0 days.

(21) Appl. No.: 14/021,994

(22) Filed: Sep. 9, 2013

(65) Prior Publication Data

US 2014/0008803 A1 Jan. 9, 2014

Related U.S. Application Data (62) Division of application No. 12/683,718, filed on Jan. 7, 2010, now Pat. No. 8,557,702.

(60) Provisional application No. 61/149,140, filed on Feb. 2, 2009.

(51) Int. Cl.
| | |
|---|---|
| *H01L 23/48* | (2006.01) |
| *H01L 23/52* | (2006.01) |
| *H01L 29/40* | (2006.01) |

(Continued)

(52) U.S. Cl.
CPC .............. *H01L 23/562* (2013.01); *C23C 16/32* (2013.01); *C23C 16/36* (2013.01); *C23C 16/45542* (2013.01); *H01L 21/28088* (2013.01);

(Continued)

(58) Field of Classification Search
USPC ............ 257/751, E21.19, E21.295, E21.584, 257/E23.01
See application file for complete search history.

(56) References Cited

U.S. PATENT DOCUMENTS

| | | |
|---|---|---|
| 2,394,930 A | 2/1946 | McRae |
| 3,895,127 A | 7/1975 | Comizzoli |

(Continued)

FOREIGN PATENT DOCUMENTS

| | | |
|---|---|---|
| EP | 0 617 481 | 9/1994 |
| EP | 0854 505 A2 | 7/1998 |

(Continued)

OTHER PUBLICATIONS

1988RD-0296076, "Field effect transistor structure with improved transconductance-contg. spacer-less conducting gate oxide, and tungsten deposition on source and drain", Anonymous, Apr. 1989.

(Continued)

*Primary Examiner* — Dale E Page
*Assistant Examiner* — Wilner Jean Baptiste
(74) *Attorney, Agent, or Firm* — Knobbe, Martens, Olson & Bear LLP (57) ABSTRACT

Methods of forming a conductive metal layer over a dielectric layer using plasma enhanced atomic layer deposition (PEALD) are provided, along with related compositions and structures. A plasma barrier layer is deposited over the dielectric layer by a non-plasma atomic layer deposition (ALD) process prior to depositing the conductive layer by PEALD. The plasma barrier layer reduces or prevents deleterious effects of the plasma reactant in the PEALD process on the dielectric layer and can enhance adhesion. The same metal reactant can be used in both the non-plasma ALD process and the PEALD process.

12 Claims, 3 Drawing Sheets

(51) Int. Cl.
  *H01L 23/00* (2006.01)
  *C23C 16/32* (2006.01)
  *C23C 16/36* (2006.01)
  *C23C 16/455* (2006.01)
  *H01L 21/28* (2006.01)
  *H01L 29/49* (2006.01)
  *H01L 29/51* (2006.01)

(52) U.S. Cl.
  CPC .......... *H01L29/4966* (2013.01); *H01L 29/517* (2013.01); *H01L 2924/0002* (2013.01)

(56) References Cited

U.S. PATENT DOCUMENTS

| | | | |
|---|---|---|---|
| 4,056,642 A | 11/1977 | Saxena et al. | |
| 4,058,430 A | 11/1977 | Suntola et al. | |
| 4,292,343 A | 9/1981 | Plaettner et al. | |
| 4,343,830 A | 8/1982 | Sarma et al. | |
| 4,436,761 A | 3/1984 | Hayashi et al. | |
| 4,486,487 A | 12/1984 | Skarp | |
| 4,544,571 A | 10/1985 | Miller | |
| 4,645,683 A | 2/1987 | Gourrier et al. | |
| 4,747,367 A | 5/1988 | Posa | |
| 4,761,269 A | 8/1988 | Conger et al. | |
| 4,766,006 A | 8/1988 | Gaczi | |
| 5,071,670 A | 12/1991 | Kelly | |
| 5,135,775 A | 8/1992 | Foller et al. | |
| 5,281,546 A | 1/1994 | Possin et al. | |
| 5,294,286 A | 3/1994 | Nishizawa et al. | |
| 5,306,666 A | 4/1994 | Izumi | |
| 5,449,314 A | 9/1995 | Meikle et al. | |
| 5,576,071 A | 11/1996 | Sandhu | |
| 5,587,205 A | 12/1996 | Saito et al. | |
| 5,625,217 A | 4/1997 | Chau et al. | |
| 5,769,950 A | 6/1998 | Takasu et al. | |
| 5,780,115 A | 7/1998 | Park et al. | |
| 5,783,478 A | 7/1998 | Chau et al. | |
| 5,793,057 A * | 8/1998 | Summerfelt | H01L 28/60 257/55 |
| 5,795,495 A | 8/1998 | Meikle | |
| 5,916,365 A | 6/1999 | Sherman | |
| 5,939,763 A | 8/1999 | Hao et al. | |
| 5,950,107 A | 9/1999 | Huff et al. | |
| 5,990,013 A | 11/1999 | Berenguer et al. | |
| 5,993,916 A | 11/1999 | Zhao et al. | |
| 6,066,533 A | 5/2000 | Yu | |
| 6,090,217 A | 7/2000 | Kittle | |
| 6,107,192 A | 8/2000 | Subrahmanyan et al. | |
| 6,166,417 A | 12/2000 | Bai et al. | |
| 6,174,799 B1 | 1/2001 | Lopatin et al. | |
| 6,174,809 B1 | 1/2001 | Kang et al. | |
| 6,200,866 B1 | 3/2001 | Ma et al. | |
| 6,225,168 B1 | 5/2001 | Gardner et al. | |
| 6,265,258 B1 | 7/2001 | Liang et al. | |
| 6,291,282 B1 | 9/2001 | Wilk et al. | |
| 6,294,836 B1 | 9/2001 | Paranjpe et al. | |
| 6,296,715 B1 | 10/2001 | Kittle | |
| 6,329,704 B1 | 12/2001 | Akatsu et al. | |
| 6,335,240 B1 | 1/2002 | Kim et al. | |
| 6,362,526 B1 | 3/2002 | Pramanick et al. | |
| 6,365,502 B1 | 4/2002 | Paranjpe et al. | |
| 6,368,954 B1 | 4/2002 | Lopatin et al. | |
| 6,368,961 B1 | 4/2002 | Lopatin et al. | |
| 6,373,111 B1 | 4/2002 | Zheng et al. | |
| 6,383,879 B1 | 5/2002 | Kizilyalli et al. | |
| 6,399,522 B1 | 6/2002 | Tsan et al. | |
| 6,407,435 B1 | 6/2002 | Ma et al. | |
| 6,458,695 B1 | 10/2002 | Lin et al. | |
| 6,482,740 B2 | 11/2002 | Soininen et al. | |
| 6,506,676 B2 | 1/2003 | Park et al. | |
| 6,511,876 B2 | 1/2003 | Buchanan et al. | |
| 6,518,106 B2 | 2/2003 | Ngai et al. | |
| 6,534,395 B2 | 3/2003 | Werkhoven et al. | |
| 6,537,901 B2 | 3/2003 | Cha et al. | |
| 6,539,891 B1 | 4/2003 | Lee et al. | |
| 6,579,767 B2 | 6/2003 | Park et al. | |
| 6,593,484 B2 | 7/2003 | Yasuhara et al. | |
| 6,596,576 B2 | 7/2003 | Fu et al. | |
| 6,613,695 B2 | 9/2003 | Pomarede et al. | |
| 6,627,503 B2 | 9/2003 | Ma et al. | |
| 6,660,660 B2 | 12/2003 | Haukka et al. | |
| 6,696,332 B2 | 2/2004 | Visokay et al. | |
| 6,700,771 B2 | 3/2004 | Bhattacharyya | |
| 6,703,708 B2 | 3/2004 | Werkhoven et al. | |
| 6,713,846 B1 | 3/2004 | Senzaki | |
| 6,714,435 B1 | 3/2004 | Dimmler et al. | |
| 6,717,226 B2 | 4/2004 | Hegde et al. | |
| 6,723,581 B1 | 4/2004 | Chabal et al. | |
| 6,730,163 B2 | 5/2004 | Vaarstra | |
| 6,730,588 B1 | 5/2004 | Schinella | |
| 6,858,524 B2 | 2/2005 | Haukka et al. | |
| 6,869,876 B2 | 3/2005 | Norman et al. | |
| 7,045,406 B2 | 5/2006 | Huotari et al. | |
| 7,141,278 B2 | 11/2006 | Koh et al. | |
| 7,235,482 B2 | 6/2007 | Wu et al. | |
| 7,485,349 B2 | 2/2009 | Koh et al. | |
| 7,547,598 B2 | 6/2009 | Choi | |
| 8,017,182 B2 | 9/2011 | Hendriks et al. | |
| 8,557,702 B2 | 10/2013 | Milligan et al. | |
| 2001/0041250 A1 | 11/2001 | Werkhoven et al. | |
| 2002/0006468 A1 | 1/2002 | Paranjpe et al. | |
| 2002/0008257 A1 | 1/2002 | Barnak et al. | |
| 2002/0030235 A1 | 3/2002 | Agarwal et al. | |
| 2002/0096724 A1 | 7/2002 | Liang et al. | |
| 2002/0102838 A1 | 8/2002 | Paranjpe et al. | |
| 2002/0121697 A1 | 9/2002 | Marsh | |
| 2003/0049942 A1 | 3/2003 | Haukka et al. | |
| 2003/0072975 A1 | 4/2003 | Shero et al. | |
| 2003/0082301 A1 | 5/2003 | Chen et al. | |
| 2003/0165615 A1 | 9/2003 | Aaltonen et al. | |
| 2004/0036129 A1 | 2/2004 | Forbes et al. | |
| 2004/0077182 A1* | 4/2004 | Lim et al. | 438/785 |
| 2004/0104439 A1 | 6/2004 | Haukka et al. | |
| 2004/0106261 A1 | 6/2004 | Huotari | |
| 2004/0219784 A1 | 11/2004 | Kang et al. | |
| 2005/0104112 A1 | 5/2005 | Haukka et al. | |
| 2006/0019494 A1 | 1/2006 | Cao et al. | |
| 2006/0175289 A1* | 8/2006 | Jung et al. | 216/57 |
| 2006/0267205 A1* | 11/2006 | Koerner | 257/762 |
| 2007/0201265 A1* | 8/2007 | Ranjan | B82Y 10/00 365/158 |
| 2007/0218670 A1 | 9/2007 | Ishizaka | |
| 2007/0251445 A1* | 11/2007 | Ishizaka | 117/92 |
| 2008/0124484 A1 | 5/2008 | Shinriki et al. | |
| 2008/0182411 A1 | 7/2008 | Elers | |
| 2009/0163024 A1 | 6/2009 | Kim et al. | |
| 2009/0261395 A1* | 10/2009 | Boescke | G11C 11/22 257/295 |
| 2010/0075494 A1 | 3/2010 | Chung et al. | |

FOREIGN PATENT DOCUMENTS

| | | |
|---|---|---|
| GB | 2372042 A | 8/2002 |
| GB | 2372043 A | 8/2002 |
| GB | 2372044 A | 8/2002 |
| JP | 60 254621 | 12/1985 |
| JP | 2000 058777 | 2/2000 |
| JP | 2000 160342 | 6/2000 |
| JP | 2005-203569 | 7/2005 |
| JP | 2012-074714 | 4/2012 |
| TW | 200846489 | 12/2008 |
| WO | WO 94/14198 | 6/1994 |
| WO | WO 00/54320 | 9/2000 |
| WO | WO 00/61833 | 10/2000 |
| WO | WO 01/29892 A1 | 4/2001 |
| WO | WO 01/29893 A1 | 4/2001 |
| WO | WO 01/66832 A2 | 9/2001 |
| WO | WO 02/20870 | 3/2002 |

(56) References Cited

FOREIGN PATENT DOCUMENTS

| WO | WO 02/43115 A2 | 5/2002 |
| WO | WO 02/50922 A1 | 6/2002 |

OTHER PUBLICATIONS

Abeles et al., Amorphous Semiconductor Superlattices, Physical Review Letters, Vo. 51, No. 21, pp. 2003-2006.
Atomic Layer Deposition Targets Thin Films, Wafer Processing, Semiconductor International, Sep. 1999.
Bai, "High K Gate Stack for Sub-0.1 UM CMOS Technology," Electrochemical Society Proceedings, vol. 99-10, pp. 39-44 (1999).
Chatterjee et al., "CMOS Metal Replacement Gate Transistors using Tantalum Pentoxide Gate Insulator," IEEE, IEDM, 0-7803-4774-9/98, pp. 777-780 (1998).
Chen et al., "0.18 μm Metal Gate Fully-Depleted SOI MOSFETs for Advanced CMOS Applications," Symposium on VLSI Technology Digest of Technical Papers, pp. 25-26 (1999).
Del-Prado et al., "Full composition range silicon oxynitride films deposited by ECR-PECVD at room temperature," Thin Solid Films, vols. 344-344, pp. 437-440 (1999).
Desu et al, Enhanced Dielectric Properties of Modified $Ta_2O_5$ Thin Films, Mat. Res. Innovat (1999) 2:299-302.
Ducroquet et al., "Full CMP Integration of CVD TiN Damascene Sub-0.1-μm Metal Gate Devices for ULSI Applications," IEEE Transactions on Eectron Devices, vol. 48, No. 8, pp. 1816-1821 (2001).
Ferguson et al., "Titanium Nitride Metal Gate Electrode: Effect of Nitrogen Incorporation," Advanced Metallization Conference 2001 (AMC 2001), pp. 115-119.
Hiltunen et al., Nitrides of Titanium, Niobium Tantalum and Molybdenum Grown as Thin Films by the Atomic Layer Epitaxy Method, Thin Solid Films, 166 (1988) pp. 149-154.
Hobbs et al., "Sub-Quarter Micron CMOS Process for TiN-Gate MOSFETs with TiO2 Gate Dielectric formed by Titanium Oxidation," Advanced Products Research and Development Lab, Symposium on VLSi Technology Digest of Technical Papers, pp. 133-134 (1999).
Ihanus et al, ALE Growth of $ZnS_1$—X $Se_x$ Thin Films by Substrating Surface Sulfur with Elemental Selenium, Applied Surface Science 112 (1997) 154-158.
International Search Report and Written Opinion dated Aug. 20, 2010 in Application No. PCT/US2010/020443.
Kaizuka et al., Conformal Chemcial Vapor Deposition TiN (111) Film Formation as an Underlayer of Al for Highly Reliable Interconnects, jpn. J. Appl. Phys. vol. 33 (1994) pp. 470-474.
Kikkawa et al., Al—Si—Cu/TiN Multilayer Interconnection and Al—Ge Reflow Sputtering Technologies for Quarter-Micron Devices, 54/SPIE vol. 1805 Submicrometer Metalization (1992).
Kikkawa et al., A Quarter-Micrometer Interconnection Technology Using a TiN/Al—Si—Cu/TiN/A1—Si—Cu/TiN/Ti Multilayer Structure, IEEE Transactions on Electron Devices, vol. 40, No. 2 Feb. 1993.
Kim et al., Thin Solid Films, vol. 289:192-198 (1996). "In-situ low-temperature (600.degree. C.) wafer surface cleaning by electron cyclotron resonance hydrogen plasma . . . ".
Kim et al., The Effects of Substrate and Annealing Ambient on the Electrical Properties of $Ta_2O_5$ Thin Films Prepared by Plasma Enhanced Chemical Vapor Deposition, Thin Film Solids 253 (1994) pp. 453-439.
Kukli et al., Atomic Layer Epitxy Growth of Tantalum Oxide Thin Films from $Ta(OC_2H_5)$ and $H_2O$, J. Electrochem. Soc. vol. 142, No. 5, May 1995 pp. 1670-1674.
Leskela et al., Atomic Layer Epitaxy in Deposition of Various Oxide and Nitride Thin Films, Journal De Physique IV, Colloque C5, Supplement au Journal de Physique II, vol. 5, Jun. 1995.
Lucovsky, G., "Integration of Alternative High-K Gate Dielectrics into Agressively Scaled CMOS Si Devices: Chemical Bonding Constraints at Si-Dielectric Interfaces," Electrochemical Society Proceedings, vol. 99-10, pp. 69-80 (1999).
Maiti et al., "PVD TiN Metal Gate MOSFETs on Bulk Silicon and Fully Depleted Silicon-On-Insulator (FDSOI) Substrates for Deep Sub-Quarter Micron CMOS Technology," IEEE, IEDM, 0-7803-4774-9/98, pp. 781-784 (1998).
Maiti et al., "Improved ultrathin oxynitride formed by thermal nitridation and low pressure chemical vapor deposition process," Applied Physics Letters, vol. 61, No. 15, pp. 1790-1792 (1992).
Martensson et al., Use of Atomic Layer Expitaxy for Fabrication of Si/TiN/Cu Structures, J. Vac Sci. Technol.B 17(5), Sep./Oct. 1999, pp. 2122-2128.
Matero et al., "Effect of water dose on the automatic layer deposition rate of oxide thin films.", Elsevier, Thin Solid Films 368 (2000) pp. 1-7.
Min et al., Atomic Layer Deposition of TiN Films by Alternate Supply of Tetrakis (ethylmethylamino)-Titatium and Ammonia, Jpn. J. Appl. Phys. vol. 37 (1998) pp. 4999-5004.
Min et al., Atomic Layer Deposition of TiN Thin Films by Sequential Introduction of Ti precursor and $NH_3$, Mat. Res. Soc. Symp. Proc. vol. 514 1998, pp. 337-342, Materials Research Society.
Nakajima et al., "Atomic-layer-deposited silicon-nitride/$SiO_2$ stacked gate dielectrics for highly reliable p-metal-oxide-semiconductor field-effect transistors," Applied Physics Letters, vol. 77, No. 18, pp. 2855-2857 (2000).
Nakajima et al., "Low-temperature formation of silicon nitride gate dielectrics by atomic-layer deposition," Applied Physics Letters, vol. 79, No. 5, pp. 665-667 (2001).
Niinisto et al., Synthesis of Oxide Thin Films and Overlayers by Atomic Layer Epitaxy for Advanced Applications, Materials Science and Engineering B41 (1996) 23-29.
Park et al., "Robust Ternary Metal Gate Electrodes for Dual Gate CMOS Devices," IEEE, IEDM, 0-7803-7050-3/02, pp. 671-674 (2001).
Polishchuk, "Dual Work Function Metal Gate CMOS Technology Using Metal Interdiffusion," IEEE Electron Device Letter, vol. 22, No. 9 pp, 444-446 (2001).
Ramm et al., Thin Solid Films, vol. 246:158-163 (1994). "Low temperature epitaxial growth by molecular beam epitaxy on hydrogen-plasma-cleaned silicon wafers".
Ritala et al., "Controlled Growth of TaN, $Ta_3 N_5$, and $TaO_x N_y$ Thin Films by Atomic Layer Deposition," Chem. Mater., vol. 11, pp. 1712-1718 (1999).
Ritala et al, Perfectly Conformal TiN and $Al_2O_3$ Films Deposited by Atomic Layer Deposition, Communications, Chemical Vapor Deposition 1999, 5, No. 1, pp. 7-9.
Ritala et al., Atomic Layer Epitaxy Growth of tiN Thin Films from $TiI_4$ and $NH_3$, J. Electrochemical Soc., vol. 145, No. 8, Aug. 1998 pp. 2914-2920.
Ritala et al., Zirconium Dioxide Thin Films Deposited by ALE Using Zirconium Tetrachloride as Precursor, Applied Surface Science, 75 (1994) pp. 333-340.
Sakaue et al., Digital Chemical Vapor Deposition of $SiO_2$ Using a Repetitive Reaction of Triethylsilane/Hydrogen and Oxidation, Japanese Journal of Applied Physics, vol. 30, No. 1B, Jan. 1990, pp. L124-L127.
Sneh et al., Atomic Layer Growth of $SiO_2$ on Si(100) Using $SiCl_4$ and $H_2O$ in a Binary Reaction Sequence, Surface Science 334 (1995) 135-152.
Suntola, T. "Atomic Layer Epitaxy", Handbook of Crystal Growth, vol. 3, Chapter 14, NH 1994, pp. 605-663.
Tiitta et al., Preparation and Characterization of Phosphorus-Doped Aluminum Oxide Thin Films, Materials Research Bulletin, vol. 33, No. 9 pp. 1315-1323 1998.
Vehkamaki et al., Growth of $SrTiO_3$ and $BaTiO_3$ Thin Films by Atomic Layer Deposition, Department of Chemistry, University of Helsinki, FIN-00014, Helsinki, Finland, Electronic and Solid State Letters, 2(10) (1999) Letters Online.
Wakabayashi et al., "A Novel W/TiNx Metal Gate CMOS Technology using Nitrogren-Concentration-Controlling $TiN_x$ Film," IEEE, IEDM, 0-7803-5410-9/99, pp. 253-256 (1999).
Wise et al, Diethyldiethoxysilane as a New Precursor for $SiO_2$ Growth of Silicon, Mat. Res. Soc. Symp. Proc. vol. 334, pp. 37-43.

(56) References Cited

OTHER PUBLICATIONS

Yagishita et al., "High Performance Damascene Metal Gate MOSFET's for 0.1 μm Regime," IEEE Transactions on Electron Devices, vol. 47, No. 5, pp. 1028-1034 (2000).

Yagishita et al., "Reduction of Threshold Voltage Deviation in Damascene Metal Gate MOSFETs," IEEE, IEDM, 0-7083-5410-9/99, pp. 257-260 (1999).

Yeo et al., "Dual-Metal Gate CMOS Technology with Ultrathin Silicon Nitride Gate Dielectric," IEEE Electronic Device Letters, vol. 22, No. 5, pp. 227-229 (2001).

Zhong et al., "Electrical Properties of $RuO_2$ Gate Electrodes for Dual Metal Gate Si-CMOS," IEEE Electron Device Letters, vol. 21, No. 12, Dec. 2000, pp. 593-595.

Office Action dated Feb. 25, 2015 in Taiwanese Application No. 099101667.

* cited by examiner

PLASMA-ENHANCED ATOMIC LAYER DEPOSITION OF CONDUCTIVE MATERIAL OVER DIELECTRIC LAYERS

CROSS-REFERENCE TO RELATED APPLICATIONS

This application is a divisional of U.S. patent application Ser. No. 12/683,718, filed Jan. 7, 2010, which claims the benefit of U.S. Provisional Patent Application No. 61/149,140, filed on Feb. 2, 2009, the entire content of which is hereby incorporated by reference and should be considered part of this specification. This application is related to U.S. Pat. No. 6,534,395, filed Mar. 6, 2001, issued Mar. 18, 2003; U.S. Pat. No. 6,613,695, filed Aug. 31, 2001, issued Sep. 2, 2003; U.S. Pat. No. 6,660,660, filed Aug. 31, 2001, issued Dec. 9, 2003; U.S. Pat. No. 6,858,524, filed May 5, 2003, issued Feb. 22, 2005; and U.S. Pat. No. 7,045,406, filed May 5, 2003, issued May 16, 2006. The entire contents of all of the above applications are hereby incorporated by reference and should be considered a part of this specification.

BACKGROUND OF THE INVENTION

1. Field of the Invention

The invention relates generally to methods and compositions for reducing the detrimental effects of plasma on metal oxide dielectric layers during plasma-enhanced atomic layer deposition (PEALD) of overlying conductive materials.

2. Description of the Related Art

Plasma-enhanced atomic layer deposition (PEALD) is a gas phase chemical process typically used to create extremely thin coatings. As in traditional atomic layer deposition (ALD) methods, in PEALD a reaction surface is alternately and sequentially contacted with reactants such that a thin film is deposited. In PEALD, one reactant is a plasma reactant, such as hydrogen (H*) plasma or hydrogen-nitrogen plasma (for example, NH*, $NH_2$*, $NH_3$*, or N*+H*). Frequently, a second reactant is an organometallic or inorganic metal source chemical.

PEALD can be used to deposit a number of refractory metals and conductive metal alloys. These materials can be used, for example, as gate electrodes or capacitor electrodes in integrated circuits devices. Frequently, a conductive layer is deposited on a metal oxide dielectric. Problems can arise when the plasma used in the deposition process reacts with the metal-oxide dielectric in the first few deposition cycles and at least partially reduces the metal-oxide dielectric back to unoxidized metal or to a substoichiometric metal oxide state. This can result in poor adhesion between the metal oxide dielectric and the overlying conductive material. While this affects the common metal oxides used in integrated circuit manufacturing, such as $Ta_2O_5$, $TiO_2$, $HfO_2$, $ZrO_2$, $Al_2O_3$, $La_2O_3$, this effect is particularly pronounced with $Al_2O_3$ and increases as the plasma intensity (e.g., power, reaction time) increases.

SUMMARY OF THE INVENTION

In accordance with one aspect of the invention, methods for forming integrated circuit devices are provided. In some embodiments, the methods comprise depositing a plasma barrier layer directly over a metal oxide dielectric layer on a substrate by an atomic layer deposition (ALD) process. The ALD process comprises alternately and sequentially contacting the substrate with a metal reactant and a non-plasma reactant. A conductive layer is subsequently deposited directly over the plasma barrier layer by a plasma-enhanced atomic layer deposition (PEALD) process. The PEALD process comprises alternately and sequentially contacting the substrate with the metal reactant and a plasma reactant.

In another aspect, methods of forming a gate electrode are provided, comprising depositing a plasma barrier layer with a thickness of about 1 to about 5 nm directly over a dielectric layer on a substrate in a reaction space by a non-plasma ALD process and subsequently depositing a conductive material directly over the plasma barrier layer by a plasma-enhanced ALD process.

In another aspect, methods of forming an integrated circuit device comprising a TaCN layer over a metal oxide dielectric layer are provided. In some embodiments, an amorphous TaCN layer is deposited directly over a metal oxide dielectric layer on a substrate by a non-plasma ALD process. A TaNC layer is deposited directly on the amorphous layer by a PEALD process.

In another aspect, an integrated circuit device is provided. The integrated circuit device comprises a dielectric layer, a plasma barrier layer over the dielectric layer, and a conductive layer. In some embodiments, the plasma barrier may comprise a first metal and may be between about 0.25 nm and about 1.75 nm thick. The conductive layer may comprise a second metal that is different from the first metal of the plasma barrier. However, in some embodiments, the first metal and second metal are the same. For example, the first and second metal may comprise TaCN.

BRIEF DESCRIPTION OF THE DRAWINGS

The invention will be better understood from the Detailed Description of the Preferred Embodiments and from the appended drawings, which are meant to illustrate and not to limit the invention, and wherein.

DETAILED DESCRIPTION OF CERTAIN EMBODIMENTS

Methods for depositing conductive films or refractory metals over a dielectric material, such as a metal oxide, by plasma-enhanced atomic layer deposition (PEALD) are provided along with related compositions and structures. When plasma is used in a PEALD process to deposit a conductive material over a dielectric, the plasma reactant can have a deleterious effect on the dielectric layer in at least the first few cycles of the PEALD process. For example, when plasma, such as H* or NH*, $NH_2$*, $NH_3$*, or N*+H* plasma, reacts with a metal oxide, a thin layer of the metal oxide may be reduced to unoxidized metal or a substoichiometric metal oxide state. In a PEALD process in which a conductive material, such as metal, is deposited directly over metal oxide, this may result in poor adhesion between the metal and the underlying metal oxide layer, making PEALD a less desirable method for use in this context. However, by depositing a plasma barrier (or interface layer) between the metal and metal oxide, as described herein, the detrimental effects of plasma on the dielectric layer can be reduced or eliminated with little to no effect on the device characteristics. In some embodiments the plasma barrier layer is an amorphous metal interface layer. The metal reactant that is used to deposit the plasma barrier layer can be the same reactant that is used in the subsequent PEALD process for depositing an overlying conductive layer, thus improving the efficiency of the process.

According to some embodiments of the invention, a plasma barrier, such as a TaCN or TiN film is formed over a metal oxide dielectric layer, such as an $Al_2O_3$ dielectric layer, on a substrate by a non-plasma ALD process. Preferably, each ALD cycle comprises two distinct deposition steps or phases. In a first phase of the deposition cycle ("the metal phase"), a first reactant comprising a metal such as tantalum is pulsed to the reaction space and chemisorbs onto the substrate surface, forming no more than about one monolayer on the surface of the substrate. The metal source material in this phase is selected such that, under the preferred conditions, the amount of source material that can be bound to the surface is determined by the number of available binding sites and by the physical size of the chemisorbed species (including ligands). The chemisorbed layer left by a pulse of the metal source chemical is self-terminated with a surface that is non-reactive with the remaining chemistry of that pulse. One of skill in the art will recognize that the self-limiting nature of this phase makes the entire ALD cycle self-limiting.

In some embodiments, the metal is tantalum and the metal source chemical is TBTDET. In other embodiments the metal is titanium and the metal source chemical is $TiCl_4$.

Excess metal source material and reaction byproducts (if any) are removed from the reaction space, e.g., by purging with an inert gas. Excess metal source material and any reaction byproducts may be removed with the aid of a vacuum generated by a pumping system.

In a second phase of the deposition cycle a second reactant, also referred to herein as a "second source chemical", is pulsed into the reaction space to react with the metal-containing molecules left on the substrate surface by the preceding pulse. In some embodiments the second source chemical is a nitrogen source compound, preferably $NH_3$, and nitrogen is incorporated into the film by the interaction of the second source chemical with the monolayer left by the metal source material. In preferred embodiments, reaction between the second source chemical and the chemisorbed metal species produces a metal nitride film over the substrate.

Any excess second source chemical and reaction byproducts, if any, are removed from the reaction space by a purging gas pulse and/or vacuum generated by a pumping system. Purge gas may be any inert gas, such as, without limitation, argon (Ar) or helium (He).

The first and second phases are repeated to form a plasma barrier of a desired thickness over the dielectric layer. The plasma barrier layer may comprise, for example, amorphous TaCN, as in the case where the metal reactant is TBTDET, or TiN, where the metal reactant is $TiCl_4$. In some embodiments the plasma barrier layer is about 2-5 nm thick.

A conductive layer is subsequently deposited by a PEALD process over the plasma barrier. In the first phase of the PEALD process, the substrate comprising the plasma barrier is exposed to the same metal source chemical that was used in the ALD process for forming the plasma barrier. For example, if TBTDET was used to form an amorphous TaCN barrier layer, the substrate is exposed to TBTDET. Similarly, if $TiCl_4$ was used to form a plasma barrier layer, $TiCl_4$ is used. Excess metal source material and reaction byproducts (if any) are removed from the reaction space, e.g., by purging with an inert gas and/or with the aid of a vacuum pump.

In a second phase of the PEALD deposition cycle a plasma reactant is provided to the reaction space to react with the metal-containing molecules left on the substrate surface by the preceding pulse. As mentioned above, in some embodiments the plasma is generated remotely and pulsed to the reaction space. In other embodiments a reactant is provided to the reaction space and the plasma is formed in situ. The reaction between the second source chemical and the chemisorbed metal species produces a conductive film over the substrate. The first and second phases are repeated to produce a film of the desired thickness. In some embodiments, such as when the metal reactant is TBTDET, the plasma reactant may be hydrogen plasma. In other embodiments, such as when the metal reactant is TiCl4, the plasma reactant may be an $NH^*$, $NH_2^*$, $NH_3^*$, or $N^*+H^*$ plasma.

The plasma barrier protects the underlying dielectric from the effects of the PEALD process, such that the qualities of the dielectric layer are not significantly changed during the PEALD process.

Figure 1:
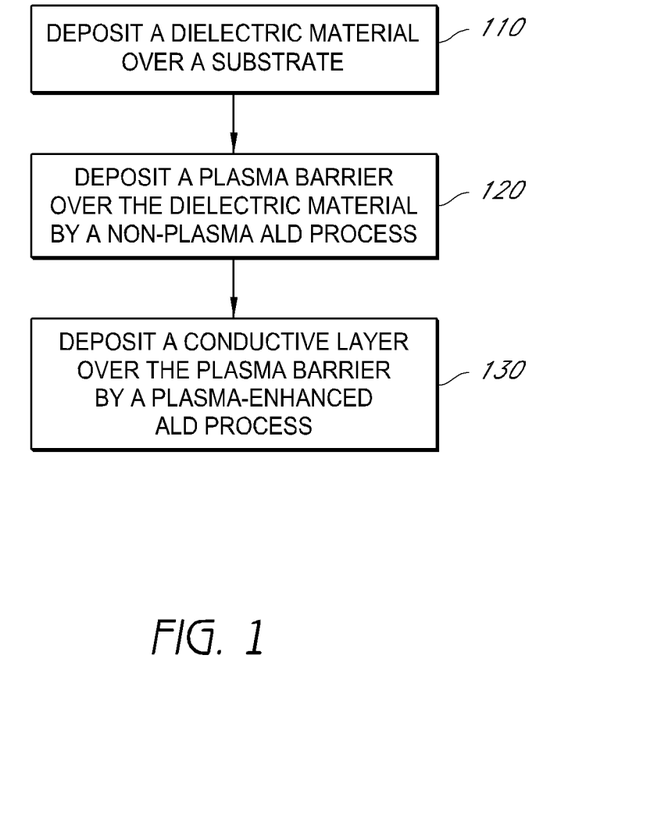
FIG. 1 is a block diagram of a process of forming a conductive layer over a dielectric material according to some embodiments.

FIG. 1 illustrates an exemplary process flow. A dielectric layer is formed by depositing a dielectric material over a substrate 110. The dielectric material is a metal oxide in some embodiments. For example, in some embodiments, the dielectric material may comprise one or more of $Ta_2O_5$, $TiO_2$, $HfO_2$, $ZrO_2$, $Al_2O_3$, $La_2O_3$, $HfSiO_x$, $HfZrO_x$, $HfAlO_x$, and $LnAlO_x$. Other known dielectric materials may also be used and can be selected by the skilled artisan based on the particular circumstances. In some particular embodiments the dielectric layer is an $Al_2O_3$ layer. The dielectric layer may be formed by any deposition process, such as by ALD or by chemical vapor deposition (CVD). In some embodiments a substrate is provided on which a dielectric layer has been formed and step 110 may be omitted.

Next, a plasma barrier layer is deposited directly over the dielectric material 120. Like the dielectric layer, the plasma barrier layer may also be deposited by any process. However, the deposition process typically will not negatively impact the properties of the dielectric layer. In some embodiments, the plasma barrier layer is deposited by a non-plasma atomic layer deposition (ALD) process 120. A non-plasma ALD process is one that does not use a plasma reactant.

Subsequently, a conductive material (or refractory metal) is deposited directly over the plasma barrier by a PEALD process 130. In this way, the potentially detrimental effect of the plasma during at least the first several PEALD cycles is reduced or avoided and good adhesion may be maintained between the conductive material and the underlying dielectric material.

The substrate is typically a work piece on which deposition is desired and can comprise a variety of materials and structures. For example and without limitation, the substrate may comprise silicon, silica, coated silicon, metal, such as copper or aluminum, dielectric materials, nitrides, oxides and/or combinations of materials.

The reaction space is typically a volume in a reactor in which conditions can be adjusted to effect film growth by ALD processes. In preferred embodiments deposition of the plasma barrier layer and the overlying conductive material takes place in the same reaction space. The reaction space can include surfaces subject to all reaction gas pulses from which gases or particles can flow to the substrate, by entrained flow or diffusion, during normal operation. The reaction space can be, for example, the reaction chamber in a single-wafer ALD reactor or the reaction chamber of a batch ALD reactor, where deposition on multiple substrates takes place at the same time. In addition, chemical vapor deposition reactors can be adapted for use in the methods. The reactor can be configured for plasma generation, either in situ or remote. Exemplary reactors include the Emer-ALD™ and Pulsar™ reactors available from ASM America (Phoenix, Ariz.).

In certain embodiments, the substrate may already comprise a dielectric material prior to being introduced to the reaction space. The dielectric material may be deposited by any standard deposition process including, but not limited to, physical vapor deposition (PVD, i.e., sputtering), chemical vapor deposition (CVD), and ALD. In some embodiments the dielectric material is deposited onto the substrate in the same reaction space as subsequent deposition of the plasma barrier layer and/or the conductive material. In other embodiments the dielectric material is deposited in a different reaction space.

As discussed above, a non-plasma ALD process is used to deposit the plasma barrier layer over the dielectric material in the reaction space. ALD is a self-limiting process, whereby sequential and alternating pulses of reactants are used to deposit no more than one atomic (or molecular) monolayer of material per deposition cycle. The deposition conditions and precursors are selected to ensure self-saturating reactions, such that an adsorbed layer in one pulse leaves a surface termination that is non-reactive with the gas phase reactants of the same pulse. A subsequent pulse of a different reactant reacts with the previous termination to enable continued deposition. Thus, each cycle of alternated pulses leaves no more than about one monolayer of the desired material. Due to the size of the chemisorbed species and the number of reactive sites, somewhat less than a monolayer may be deposited in each cycle. The principles of ALD type processes have been presented, for example, by T. Suntola in, e.g. the Handbook of Crystal Growth 3, Thin Films and Epitaxy, Part B: Growth Mechanisms and Dynamics, Chapter 14, Atomic Layer Epitaxy, pp. 601-663, Elsevier Science B.V. 1994, the disclosure of which is incorporated herein by reference.

In a typical ALD-type process for depositing a plasma barrier layer, one deposition cycle comprises exposing the substrate to a first reactant, removing any unreacted first reactant and reaction byproducts from the reaction space, exposing the substrate to a second reactant, followed by a second removal step. The first reactant is preferably a metal precursor and the second reactant is preferably a non-plasma reactant that reacts with the metal reactant to form the desired film. A person skilled in the art would recognize that the ALD-type process may begin with provision of either reactant. Depending on the particular material being deposited, additional non-plasma reactants may be provided alternately and sequentially in the ALD process to provide a material of the desired composition.

The separation of reactants by inert gases, such as Ar, prevents gas-phase reactions between reactants and enables self-saturating surface reactions. Because the reactions self-saturate, strict temperature control of the substrates and precise dosage control of the precursors is not required. However, the substrate temperature is preferably such that an incident gas species does not condense into monolayers nor decompose on the surface. Surplus chemicals and reaction byproducts, if any, are removed from the reaction space before the next reactive chemical pulse is introduced into the chamber. Undesired gaseous molecules can be effectively expelled from the reaction space with the help of an inert purging gas. The purging gas directs the superfluous molecules out of the chamber. A vacuum pump may be used to assist in the purging.

The material of the plasma barrier and thickness are selected such that the PEALD process for depositing the overlying conductive material does not significantly change the characteristics of the underlying dielectric layer.

The plasma barrier layer typically comprises a metal and may be, for example, an elemental metal, a conductive metal nitride, a metal carbide-nitride, a metal carbide, a metal silicon nitride, or a metal silicon carbide. The ALD process for depositing the plasma barrier layer preferably uses the same metal precursor as the subsequent PEALD process for depositing the overlying conductive layer. Thus, in some embodiments, the plasma barrier and the overlying conductive layer comprise the same metal. The plasma barrier may comprise, for example, one or more metals selected from the group consisting of titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), iron (Fe), cobalt (Co), nickel (Ni), palladium (Pd), platinum (Pt), rhodium (Rh), iridium (Ir), ruthenium (Ru) and osmium (Os). A skilled artisan would realize that other materials may be used within the scope of the present invention.

Metal precursors that can be used in the ALD and PEALD processes are known in the art and include both organic and inorganic metal compounds. In some embodiments, metal halide reactants, such as, e.g., $TaCl_5$ and $HfCl_4$, are used as metal precursors in the ALD deposition of the plasma barrier (and/or in the deposition of the overlying conductive layer). These precursors are generally inexpensive and relatively stable, but at the same time reactive towards different types of surface groups. In other embodiments, the metal precursor is a vapor phase species comprising at least one of Ti, Hf, Zr, Si, Al, Ta, Sr, Ba, Sc, Y, La, Eu, and Dy.

In some particular embodiments, the metal reactant is a titanium reactant. The titanium reactant may be, for example, $TiCl_4$. In other particular embodiments the metal reactant is a tantalum reactant. In some embodiments the tantalum reactant is a tantalum halide. In other embodiments the tantalum reactant is tert-butylimido-tris(diethylamido) tantalum (TBTDET).

In some embodiments, the plasma barrier is a conductive metal nitride and a non-plasma reactant comprises a nitrogen source that reacts with adsorbed metal reactant to form a metal nitride. In other embodiments, the plasma barrier is a conductive metal carbide and the non-plasma reactant comprises a carbon source that reacts with the adsorbed metal reactant to form a metal carbide. In other embodiments, the plasma barrier is a conductive metal nitride-carbide and a carbon source is also utilized. The carbon source and the nitrogen source may be the same compound or may be different compounds.

The nitrogen source compound may be, for example, one or more of ammonia ($NH_3$) and its salts, hydrogen azide ($HN_3$) and the alkyl derivates thereof, hydrazine ($N_2H_4$) and salts of hydrazine, alkyl derivates of hydrazine, primary, secondary and tertiary amines, tertbutylamide, $CH_3N_3$, hydrazine hydrochloride, dimethyl hydrazine, hydroxylamine hydrochloride, methylamine, diethylamine, and triethylamine. A skilled artisan would realize that other materials may be used within the scope of the present invention.

In other embodiments, a non-plasma reactant is a reducing agent that reduces the metal reactant to an elemental metal.

Briefly, in a typical non-plasma ALD process a metal reactant is provided into the reaction chamber. After sufficient time for the metal reactant to adsorb on the substrate surface, the excess metal reactant and reaction by-products, if any, are removed from the reaction space. This may be accomplished, for example, by purging and/or by evacuating the reaction space with the aid of a vacuum pump. In embodiments where the precursor is provided with the aid of an inert carrier gas, the same gas may be used to purge the reaction space by stopping the flow of the precursor into the stream of the carrier gas, while continuing to flow the carrier gas. A second, non-plasma reactant is then introduced into the reaction space and removed in like manner after sufficient time for the non-plasma reactant to react with the previously adsorbed metal reactant. Additional non-plasma reactants can be provided in the ALD process to achieve the desired composition.

Figure 2A:
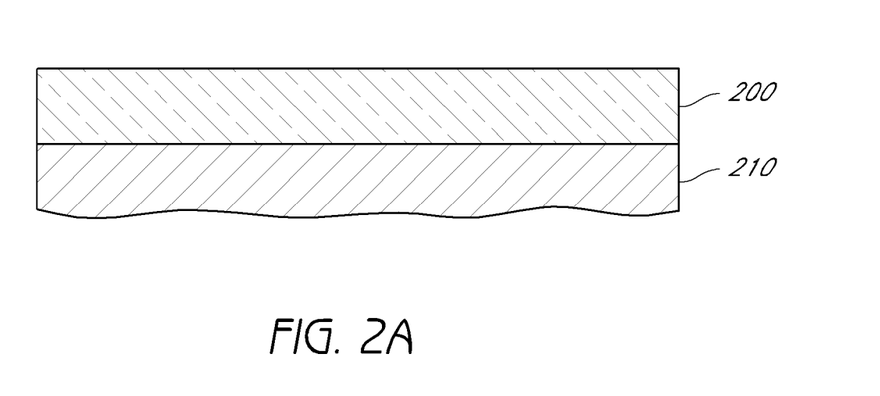
FIGS. 2A-C are schematic illustrations of a method of forming a conductive layer over a dielectric material according to some embodiments.

FIG. 2A illustrates a substrate 210 with an overlying dielectric layer 200. As illustrate in FIG. 2B, a plasma barrier 220 is deposited by a non-plasma ALD process directly over the dielectric layer 200.

A skilled artisan would understand that the plasma barrier is deposited to a thickness that prevents the plasma from reacting to a significant extent with the underlying dielectric layer. The plasma barrier may generally be about 0.1 nm to about 50 nm. For some embodiments, the plasma barrier may be about 0.5 nm to about 5 nm. In other embodiments, the plasma barrier may be about 0.5 nm to about 3.5 nm.

In some embodiments, the ALD cycle for depositing the plasma barrier material is repeated more than 120 times, preferably at least 200 times to form a plasma barrier prior to PEALD of the conductive material.

Following deposition of the plasma barrier layer, a PEALD process is used to deposit a conductive material or refractory metal directly over the plasma barrier. In some embodiments, the same metal reactant that is used in the deposition of the plasma barrier is used in the deposition of the overlying conductive material. The same metal reactant that was used in the non-plasma ALD cycle may be used in the PEALD cycle. In other embodiments, different metal reactants are used.

In some embodiments, in the first few PEALD cycles, the plasma reactant may react with the plasma barrier. In some embodiments, the plasma reactant reacts with the plasma barrier in about the first about 10 to 100 PEALD cycles.

In some embodiments, the plasma reactant changes the properties of at least a portion of the plasma barrier, for example through one or more of stoichiometric change, crystallization, increased density and lowering resistivity. For example, if the plasma barrier is formed of an amorphous metal, during PEALD, a portion of the amorphous metal may be converted into a crystalline metal phase. In some embodiments, the properties of about 1 to 5 nm, more preferably about 3 to 4 nm of the plasma barrier are changed. The remaining portion of the plasma barrier is preferably thin enough that it does not set the work function or adversely impact the device characteristics. In some embodiments, only about 1 to 5 nm, more preferably about 1 to 2 nm of the plasma barrier remains unchanged following PEALD deposition of the overlying conductive material. In some embodiments, between about 0.25 nm and about 1.75 nm of the plasma barrier remains unchanged following PEALD deposition of the overlying conductive material. In still other embodiments, between about 0.125 nm and about 0.875 nm or between about 0.05 nm and about 0.35 nm of the plasma barrier remains unchanged.

In certain embodiments, the plasma barrier comprises an amorphous material, a portion of which is converted to a crystalline form during PEALD of the overlying conductive material. The converted crystalline material from the plasma barrier may be the same in material and structure as and may substantially align with the PEALD deposited conductive material. A skilled artisan would therefore consider the converted portion of the plasma barrier in determining the desired thickness of the conductive material. For example, the plasma barrier may be deposited as an amorphous metal nitride. Following PEALD of an overlying conductive metal nitride, a portion of the amorphous metal nitride of the barrier layer is converted to the same crystalline metal nitride as the overlying conductive layer.

The overlying conductive material may be any conductive material known in the art, including conductive metal alloys. For example, the conductive material may be TaCN or TiN. In other embodiments the conductive material is a refractory metal.

Generally, a metal precursor and one or more plasma reactants are introduced into the reaction chamber alternately and sequentially. The metal reactant can be generally as described above with respect to the plasma barrier. In some embodiments, the plasma reactant may be a plasma-excited species of hydrogen or a hydrogen-nitrogen plasma generated by, e.g., an in situ or remote plasma generator. Additional reactants may be utilized to achieve the desired composition, as will be recognized by the skilled artisan.

Plasma-excited species of hydrogen may include, without limitation, hydrogen radicals (H*) and hydrogen cations (e.g., $H^+$, $H_2^+$), plasma, or other plasma-excited species known to a person skilled in the art. Plasma-excited species of hydrogen may be formed in situ or remotely, for example from molecular hydrogen ($H_2$) or hydrogen-containing compounds (e.g., silane, diborane, etc). In other embodiments the plasma reactant is a hydrogen-nitrogen plasma (for example, NH*, $NH_2$*, $NH_3$*, or N*+H*) or a hydrogen-carbon plasma (CH*). In some embodiments, more than one plasma reactant is used to produce a conductive material with the desired composition.

Figure 2B:
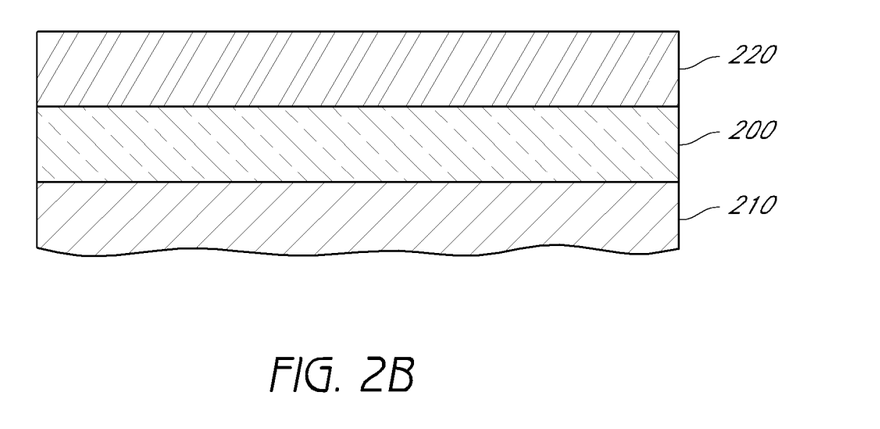

Briefly, a metal reactant is provided into the reaction chamber. In some embodiments, the metal reactant is the same reactant that was used to deposit the plasma barrier layer. After sufficient time for the metal precursor to adsorb on the substrate surface, the excess metal reactant and reaction by-products, if any, are removed from the reaction space. This may be accomplished, for example, by purging and/or by evacuating the reaction space with the aid of a vacuum pump. In embodiments where the precursor is provided with the aid of an inert carrier gas, the same gas may be used to purge the reaction space by stopping the flow of the precursor into the stream of the carrier gas, while continuing to flow the carrier gas. The second precursor is then introduced into the reaction space and removed in like manner after sufficient time for the second precursor to adsorb onto the substrate surface. As noted above, typically, the plasma reactant in the first about 10 to about 100 PEALD cycles may react with the plasma barrier 220. As the thickness of the conductive layer 230 increases during deposition, less plasma reacts with the plasma barrier 220.

Figure 2C:
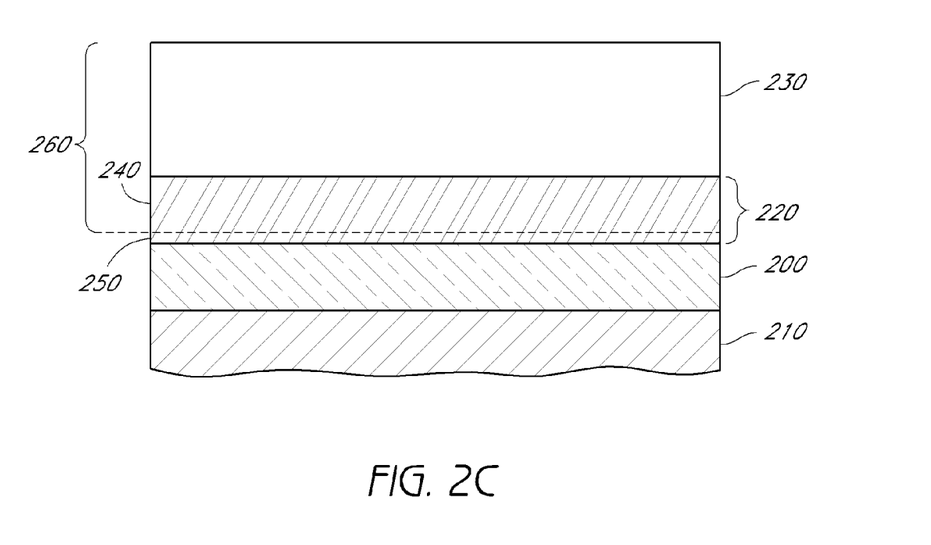

FIG. 2C shows the structure of FIG. 2B after deposition of an overlying conductive layer according to some embodiments. The structure comprises a dielectric material 200, such as a metal oxide, over the substrate 210. The plasma barrier 220 is formed on the dielectric material 200. The PEALD process forms a conductive material 230, for example a crystalline conductive metal nitride, over the dielectric material 200. When the plasma reactant from the PEALD process reacts with the plasma barrier 220, at least a portion 240 of the plasma barrier 220 is converted to a different phase, while a portion remains in the unconverted phase 250. In certain embodiments, the unconverted phase 250 is an amorphous material, such as a metal, and the converted phase 240 is the same material, but in a crystalline phase. In some embodiments, the converted metal phase 240 is the same as the overlying conductive material 230. In still other embodiments, the converted crystalline material 240 and the conductive material 230 substantially align in their crystalline structure to form a consolidated conductive layer 260.

In some embodiments, the converted plasma barrier 240 is between about 1 nm and about 5 nm, more preferably between about 3 nm and about 4 nm. In some embodiments, the unconverted plasma barrier 250 is between about 1 nm and about 5 nm, more preferably between about 1 nm and about 2 nm. In other embodiments, the unconverted plasma barrier 250 is between about 0.25 nm and about 1.75 nm. In still other embodiments, the unconverted plasma barrier 250 is between about 0.125 nm and about 0.875 nm or between about 0.05 nm and about 0.35 nm.

EXAMPLE 1

A TiN plasma barrier layer was deposited as a plasma barrier layer on an $Al_2O_3$ dielectric layer prior to deposition of a TiN conductive layer by PEALD.

Plasma Barrier

A titanium nitride (TiN) barrier layer was deposited on an aluminum oxide ($Al_2O_3$) dielectric material on a substrate by an ALD-type process. The sequence of steps in the process included alternately and sequentially pulsing a metal compound ($TiCl_4$), a nitrogen source compound ($NH_3$), and a purge gas (Ar) into a reaction space containing the substrate at a reaction temperature of about 375° C. The sequence of gas pulses and purges was as follows:
 (1) $TiCl_4$ pulse;
 (2) Ar purge;
 (3) $NH_3$ pulse; and
 (4) Ar purge.
Steps (1)-(4) were repeated to form a uniform TiN barrier layer of about 5 nm.

Conductive Layer

A TiN conductive layer was then deposited directly on the TiN barrier layer by a plasma-enhanced ALD-type process in the same reaction chamber. A metal compound ($TiCl_4$), a hydrogen-nitrogen (NH*) plasma, and a purge gas (Ar) were alternately and sequentially pulsed into a reaction space containing the substrate at a reaction temperature of about 375° C. The sequence of gas pulses and purges was as follows:
 (1) $TiCl_4$ pulse;
 (2) Ar purge;
 (3) NH* pulse; and
 (4) Ar purge.
Steps (1)-(4) were repeated to form a uniform TiN conductive layer of about 10 nm. The NH* plasma converted up to 4 nm of the amorphous TiN to crystalline TiN, leaving about 1-2 nm of amorphous TiN between the $Al_2O_3$ dielectric material and the crystalline TiN conductive layer.

EXAMPLE 2

A TaCN plasma barrier layer was deposited as a plasma barrier layer on an $Al_2O_3$ dielectric layer by thermal ALD prior to deposition of a TaCN conductive layer by PEALD.

Plasma Barrier

An amorphous TaCN layer was deposited as a plasma barrier layer on an amorphous aluminum oxide ($Al_2O_3$) dielectric material on a substrate by an ALD-type process. The sequence of steps in the process included alternately and sequentially pulsing a tantalum compound (TBTDET), a nitrogen source compound ($NH_3$), and a purge gas (Ar) into a reaction space containing the substrate at a reaction temperature of about 300° C., reaction pressure of about 1.5 Torr, and power of about 275 W. The sequence of gas pulses and purges was as follows:
 (1) TBTDET pulse;
 (2) Ar purge;
 (3) $NH_3$ pulse; and
 (4) Ar purge.
Steps (1)-(4) were repeated to form a uniform TaCN barrier layer of about 15 Å having a resistivity of about 30 mΩcm-2 Ωcm with a density of about 9.5-10.5 g/cc.

Conductive Layer

A TaCN conductive layer was then deposited directly on the plasma barrier layer by a plasma-enhanced ALD-type process in the same reaction chamber. TBTDET, a hydrogen (H*) plasma, and a purge gas (Ar) were alternately and sequentially provided into a reaction space containing the substrate at a reaction temperature of about 375° C. The sequence of gas pulses and purges was as follows:
 (1) TBTDET pulse;
 (2) Ar purge;
 (3) H* pulse; and
 (4) Ar purge.
Steps (1)-(4) were repeated to form a uniform TaCN conductive layer of about 10 nm having a controllable resistivity of about 240 μΩcm-2000 μΩcm with a density of about 11-12.5 g/cc and a variable lattice constant. The H* converted up to 4 nm of the amorphous TaCN to crystalline TaCN, leaving about 1-2 nm of amorphous TaCN between the $Al_2O_3$ dielectric material and the crystalline TiN conductive layer.

EXAMPLE 3

A TaCN plasma barrier layer was deposited as a plasma barrier layer on an $Al_2O_3$ dielectric layer by thermal ALD prior to deposition of a TaC conductive layer by PEALD.

Plasma Barrier

An amorphous TaCN layer was deposited as a plasma barrier layer on a gamma phase aluminum oxide ($Al_2O_3$) dielectric material on a substrate by an ALD-type process. The sequence of steps in the process included alternately and sequentially pulsing a tantalum compound (TBTDET), a nitrogen source compound ($NH_3$), and a purge gas (Ar) into a reaction space containing the substrate at a reaction temperature of about 300° C., reaction pressure of about 1.5 Torr, and power of about 275 W. The sequence of gas pulses and purges was as follows:

(1) TBTDET pulse;
(2) Ar purge;
(3) NH$_3$ pulse; and
(4) Ar purge.

Steps (1)-(4) were repeated about 120 cycles to form a uniform TaCN barrier layer having a resistivity of about 30 mΩcm-2 Ωcm with a density of about 9.5-10.5 g/cc.

Conductive Layer

A TaC conductive layer was then deposited directly on the plasma barrier layer by a plasma-enhanced ALD-type process in the same reaction chamber. TBTDET, a hydrogen (H*) plasma, and a purge gas (Ar) were alternately and sequentially provided into a reaction space containing the substrate at a reaction temperature of about 375° C. The sequence of gas pulses and purges was as follows:

(1) TBTDET pulse;
(2) Ar purge;
(3) H* pulse; and
(4) Ar purge.

Steps (1)-(4) were repeated to form a uniform TaC conductive layer of about 10 nm having a controllable resistivity of about 240 µΩcm-2000 µΩcm with a density of about 11-12.5 g/cc and a variable lattice constant. The H* converted up to 4 nm of the amorphous TaCN to crystalline TaCN, leaving about 1-2 nm of amorphous TaCN between the Al$_2$O$_3$ dielectric material and the crystalline TaCN conductive layer.

As will be apparent to the skilled artisan, various modifications, omissions and additions may be made to the methods and structures described above without departing from the scope of the invention. All such modifications and changes are intended to fall within the scope of the invention, as defined by the appended claims.

What is claimed is:

1. An integrated circuit device comprising:
   a metal oxide dielectric layer;
   an amorphous plasma barrier layer directly over and contacting the metal oxide dielectric layer, wherein the amorphous plasma barrier layer is between about 0.25 nm and about 1.75 nm thick and comprises an elemental metal, a conductive metal nitride, a metal carbide-nitride, a metal carbide, a metal silicon nitride, or a metal silicon carbide; and
   a consolidated crystalline conductive layer comprising a converted crystalline material layer directly over and contacting the amorphous plasma barrier layer and a conductive material layer directly over and contacting the converted crystalline material, wherein the conductive material is chosen from the group consisting of TaCN and TiN.

2. The integrated circuit device of claim 1, wherein the amorphous plasma barrier is between about 0.125 nm and about 0.875 nm thick.

3. The integrated circuit device of claim 2, wherein the amorphous plasma barrier is between about 0.05 nm and about 0.35 nm thick.

4. The integrated circuit device of claim 1, wherein the dielectric layer is chosen from the group consisting of Ta$_2$O$_5$, TiO$_2$, HfO$_2$, ZrO$_2$, Al$_2$O$_3$, La$_2$O$_3$, HfSiO$_x$, HfZrO$_x$, HfAlO$_x$, and LnAlO$_x$.

5. The integrated circuit device of claim 4, wherein the dielectric layer is Al$_2$O$_3$.

6. The integrated circuit device of claim 1, wherein the amorphous plasma barrier comprises at least one of the group consisting of Ti, Zr, Hf, V, Nb, Ta, Cr, Mo, W, Mn, Re, Fe, Co, Ni, Pd, Pt, Rh, Ir, Ru and Os.

7. The integrated circuit device of claim 6, wherein the amorphous plasma barrier comprises TaCN.

8. The integrated circuit device of claim 1, wherein the conductive material layer comprises TaCN.

9. The integrated circuit device of claim 1, wherein the converted crystalline material and the conductive material align in their crystalline structure.

10. The integrated circuit device of claim 1, wherein the amorphous plasma barrier layer, the converted crystalline material and the conductive material each comprises the same metal.

11. The integrated circuit device of claim 10, wherein the amorphous plasma barrier layer, the converted crystalline material and the conductive material each comprises Ta.

12. The integrated circuit device of claim 1, wherein the amorphous plasma barrier layer, the converted crystalline material and the conductive material each comprises TaCN.

* * * * *